(12) United States Patent
Domae et al.

(10) Patent No.: US 8,633,276 B2
(45) Date of Patent: Jan. 21, 2014

(54) THERMALLY CONDUCTIVE SILICONE COMPOSITION AND ELECTRONIC DEVICE

(75) Inventors: Narumasa Domae, Chiba (JP); Tomoko Kato, Ichihara (JP); Kazumi Nakayoshi, Sodegaura (JP)

(73) Assignee: Dow Corning Toray Company, Ltd., Chyoda-ku, Tokyo (JP)

( * ) Notice: Subject to any disclaimer, the term of this patent is extended or adjusted under 35 U.S.C. 154(b) by 125 days.

(21) Appl. No.: 12/994,475

(22) PCT Filed: May 12, 2009

(86) PCT No.: PCT/JP2009/059230
§ 371 (c)(1),
(2), (4) Date: Apr. 25, 2011

(87) PCT Pub. No.: WO2009/145086
PCT Pub. Date: Dec. 3, 2009

(65) Prior Publication Data
US 2011/0188213 A1    Aug. 4, 2011

(30) Foreign Application Priority Data
May 27, 2008 (JP) .................................. 2008-138777

(51) Int. Cl.
*C08L 83/06* (2006.01)

(52) U.S. Cl.
USPC ........................................................ 524/588

(58) Field of Classification Search
USPC ........................................................ 524/588
See application file for complete search history.

(56) References Cited

U.S. PATENT DOCUMENTS

| 6,306,957 B1 | 10/2001 | Nakano et al. |
| 6,380,301 B1 | 4/2002 | Enami et al. |
| 2006/0135687 A1 * | 6/2006 | Fukui ............................ 524/588 |

FOREIGN PATENT DOCUMENTS

| EP | 0778307 A2 | 6/1997 |
| EP | 1101798 A2 | 5/2001 |
| JP | 2000256558 A | 9/2000 |
| JP | 2001139815 A | 5/2001 |
| WO | WO 2004072181 A2 | 8/2004 |

OTHER PUBLICATIONS

Freeman (Silicones, Published for the Plastics Institute, ILIFFE Books Ltd. (1962) pp. 79-80).*
English language abstract for JP 2000256558 extracted from espacenet.com database Jun. 16, 2011, 20 pages.
English language abstract for JP 2001139815 extracted from espacenet.com database Jun. 16, 2011, 20 pages.
International Search Report for Application No. PCT/JP2009/059230 dated May 12, 2009, 3 pages.

* cited by examiner

*Primary Examiner* — Kuo-Liang Peng
(74) *Attorney, Agent, or Firm* — Howard & Howard Attorneys PLLC

(57) ABSTRACT

A thermally conductive silicone composition of the invention comprises: (A) an organopolysiloxane having a viscosity of at least 500 mPa·s at 25° C.; (B) a thermally conductive filler; (C) a fine silica powder; (D) an organopolysiloxane having a hydrolyzable group and having a viscosity of less than 500 mPa·s at 25° C.; and (E) a silane compound containing a hydrolyzable group. The composition possesses excellent handleability and workability at low viscosity and which, after application onto surfaces, is not subject to slipping-off when this surface assumes a vertically position, even under harsh temperature conditions.

12 Claims, 4 Drawing Sheets

THERMALLY CONDUCTIVE SILICONE COMPOSITION AND ELECTRONIC DEVICE

RELATED APPLICATIONS

This application is the National Stage and claims priority to and all the advantages of International Patent Application No. PCT/JP2009/059230, filed on May 12, 2009, which claims priority to Japanese Patent Application No. JP2008-138777, filed on May 27, 2008.

TECHNICAL FIELD

The present invention relates to a thermally conductive silicone composition, and to an electronic device that employs the aforementioned composition.

BACKGROUND ART

Following recent increase in the degree of density and integration of hybrid ICs and printed circuit boards that carry transistors, ICs, memory elements, and other electronic components, various thermally conductive silicone greases, thermally conductive silicone gel compositions, thermally conductive silicone rubber compositions, or the like have been used in order to achieve efficient heat dissipation from such devices.

In order to improve thermal conductivity of the aforementioned conductive silicone compositions by increasing the degree of filling with thermally conductive fillers, it was proposed, as disclosed, e.g., in Japanese Unexamined Patent Application Publication (hereinafter referred to as "Kokai") 2000-256558, to use a thermally conductive silicone rubber composition comprising an organopolysiloxane, a methylpolysiloxane that contains hydrolyzable groups, a thermally conductive filler, and a curing agent. Furthermore, Kokai 2001-139815 discloses a thermally conductive silicone rubber composition that comprises a curable organopolysiloxane, a curing agent, and a thermally conductive filler, wherein the filler is surface-treated with an oligosiloxane that contains silicon-bonded alkoxy groups.

However, if for improving handleability and workability of such thermally conductive silicone compositions their viscosity is lowered, then after the coated surface assumes vertical position, the coating begins to slip-off.

It is an object of the present invention to provide a thermally conductive silicone composition which possesses excellent handleability and workability at low viscosity and which, after application onto surfaces, is not subject to slipping-off when this surface assumes a vertically position, even under harsh temperature conditions. It is another object to provide an electronic device that employs the aforementioned composition.

DISCLOSURE OF INVENTION

A thermally conductive silicone composition of the invention comprises:

(A) 100 parts by mass of an organopolysiloxane having a viscosity of at least 500 mPa·s at 25° C.;

(B) 400 to 3,500 parts by mass of a thermally conductive filler;
(C) 0.1 to 10 parts by mass of a fine silica powder;
(D) an organopolysiloxane represented by the general formula given below and having a viscosity of less than 500 mPa·s at 25° C.:

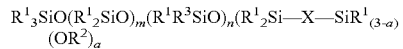

{wherein X represents an oxygen atom or a bivalent hydrocarbon group having 2 to 10 carbon atoms; $R^1$ represents identical or different monovalent hydrocarbon groups which are free of unsaturated aliphatic bonds; $R^2$ represents groups selected from alkyl groups, alkoxyalkyl groups, alkenyl groups, or acyl groups; $R^3$ is represented by the following general formula: $-X-SiR^1_{(3-b)}(OR^2)_b$ (wherein X, $R^1$, and $R^2$ are the same as defined above; and "b" is an integer ranging from 1 to 3); "a" is an integer ranging from 0 to 3; "m" is an integer equal to or greater than 0; and "n" is an integer equal to or greater than 0; however, when "a" is equal to 0, "n" is an integer equal to or greater than 1} (component (D) is used in an amount of 0.005 to 10 parts by mass per 100 parts by mass of component (B)); and (E) a silane compound of the following general formula:

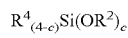

(wherein $R^4$ is a group selected from a monovalent hydrocarbon group, epoxy-containing organic group, methacryl-containing organic group, or an acryl-containing organic group; and $R^2$ is the same as defined above; and "c" is an integer ranging from 1 to 3) (component (E) is used in an amount of 0.005 to 10 parts by mass per 100 parts by mass of component (B)).

Component (B) may be a thermally conductive filler selected from a metal oxide, metal hydroxide, nitride, carbide, graphite, or a mixture thereof. More specifically, component (B) may be a thermally conductive filler of at least one type selected from the group consisting of aluminum oxide, zinc oxide, magnesium oxide, titanium oxide, beryllium oxide, aluminum hydroxide, and magnesium hydroxide.

Furthermore, component (B) may be surface-treated with components (D) and (E) in component (A).

An electronic device of the invention comprises a heat-dissipating member, and electronic parts or to circuit boards which support the electronic parts, wherein the heat-dissipating member is attached to the electronic parts or to the circuit boards through the aforementioned thermally conductive silicone composition.

Effects of Invention

The thermally conductive silicone composition of the invention possesses excellent handleability and workability, and resists sliding-off when the surface coated with this composition assumes a vertical position, even under harsh temperature conditions. And the electronic device of the present invention possesses excellent reliability.

Figure 1:
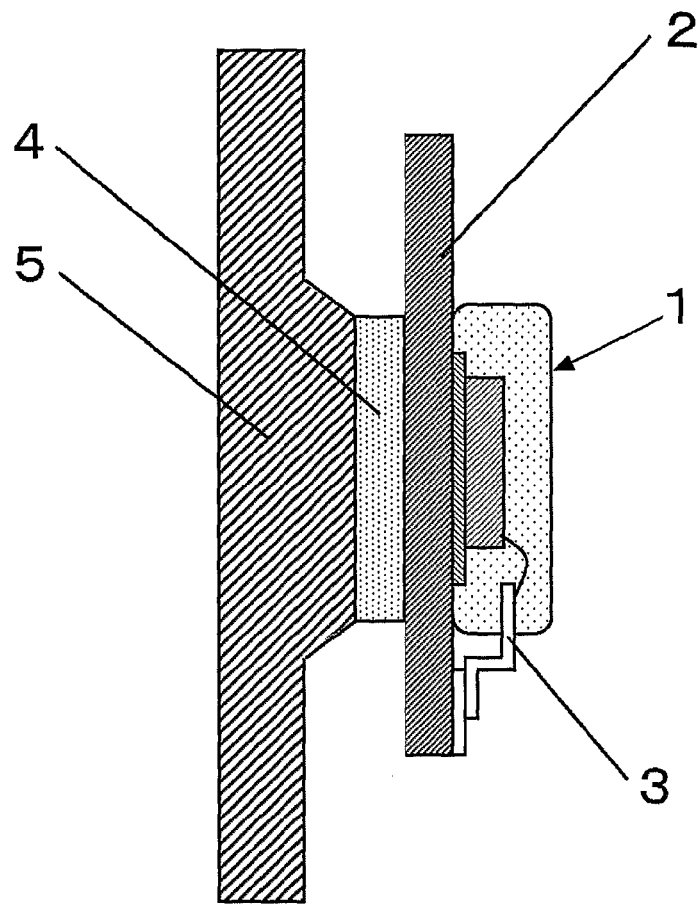
FIG. 1 is a cross-sectional view through an electronic device of the invention.

| Reference Numerals Used in the Description | |
| --- | --- |
| 1 | electronic part |
| 2 | circuit board |
| 3 | output lead wire |
| 4 | thermally conductive silicone composition |
| 5 | heat-dissipating member |
| 6 | copper plate |
| 7 | thermally conductive silicone composition |
| 8 | spacer |
| 9 | glass plate |
| 10 | clip |

DETAILED DESCRIPTION OF THE INVENTION

The thermally conductive silicone composition of the invention will be further described in more details.

The organopolysiloxane of component (A) is a main component of the composition. At 25° C., this component should have a viscosity of at least 500 mPa·s, preferably in the range of 500 to 100,000 mPa·s, more preferably in the range of 1,000 to 100,000 mPa·s, and most preferably in the range of 1,000 to 50,000 mPa·s. If the viscosity of component (A) is below the recommended lower limit, this will reduce the viscosity of the obtained silicone composition, which will be subject to slipping-off after the surface coated with the composition assumes a vertical position. On the other hand, if the viscosity of component (A) exceeds the recommended upper limit, this will impair handleability and workability of the obtained silicone composition.

There are no special restrictions with regard to the molecular structure of component (A) and it may have a linear, branched, partially branched linear molecular structure, or a dendrimer-type molecular structure, of which the linear molecular structure and a partially branched linear molecular structure are preferable. Component (A) may comprise a homopolymer having the aforementioned molecular structure, a copolymer having the aforementioned molecular structure, or a mixture thereof. Examples of the silicon-bonded groups of component (A) are the following: methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, or other linear-chain alkyl groups; isopropyl, tertiary butyl, isobutyl, 2-methylundecyl, 1-hexylheptyl, or similar branched-chain alkyl groups; cyclopentyl, cyclohexyl, cyclododecyl, or similar cyclic alkyl groups; vinyl, allyl, butenyl, pentenyl, hexenyl, or similar alkenyl groups; phenyl, tolyl, xylyl, or similar aryls; benzyl, phenethyl, 2-(2,4,6-trimethylphenyl) propyl, or similar aralkyl groups; 3,3,3-trifluoropropyl, 3-chloropropyl, or similar halogenated alkyl groups. Most preferable are alkyl, alkenyl, and aryl groups, especially methyl, vinyl, and phenyl groups. When component (A) contains alkenyl groups, even in a vertical position of the surface coated with the composition, the coating will over a long time resist to slip-off, even under harsh temperature conditions.

Component (A) may be exemplified by the following specific compounds: a dimethylpolysiloxane capped at both molecular terminals with dimethylvinylsiloxy groups; a dimethylpolysiloxane capped at both molecular terminals with methylphenylvinylsiloxy groups; a copolymer of a methylphenylsiloxane and a dimethylsiloxane capped at both molecular terminals with dimethylvinylsiloxy groups; a copolymer of a methylvinylsiloxane and a dimethylsiloxane capped at both molecular terminals with dimethylvinylsiloxy groups; a copolymer of a methylvinylsiloxane and a dimethylsiloxane capped at both molecular terminals with trimethylsiloxy groups; a methyl (3,3,3-trifluoropropyl) polysiloxane capped at both molecular terminals with dimethylvinylsiloxy groups; a copolymer of a methylvinylsiloxane and a dimethylsiloxane capped at both molecular terminals with silanol groups; a copolymer of a methylphenylsiloxane, methylvinylsiloxane, and a dimethylsiloxane capped at both molecular terminals with silanol groups; an organosiloxane copolymer composed of the siloxane units represented by the following unit formulae: $(CH_3)_3SiO_{1/2}$, $(CH_3)_2(CH_2=CH)SiO_{1/2}$, $CH_3SiO_{3/2}$, and $(CH_3)_2SiO_{2/2}$; a dimethylpolysiloxane capped at both molecular terminals with silanol groups; a copolymer of a methylphenylsiloxane and a dimethylsiloxane capped at both molecular terminals with silanol groups; a dimethylpolysiloxane capped at both molecular terminals with trimethoxysiloxy groups; a copolymer of a dimethylsiloxane and a methylphenylsiloxane capped at both molecular terminals with trimethylsiloxy groups; a dimethylpolysiloxane capped at both molecular terminals with methyldimethoxysiloxy groups; a dimethylpolysiloxane capped at both molecular terminals with triethoxysiloxy groups; a dimethylpolysiloxane capped at both molecular terminals with trimethoxysilyl-ethyl groups; or a mixture of two or more of the above compounds.

The thermally conductive filler of component (B) is used for imparting thermal conductivity to the composition of the invention. Component (B) can be represented, e.g., by aluminum oxide, zinc oxide, magnesium oxide, titanium oxide, beryllium oxide, or a similar metal oxide; aluminum hydroxide, magnesium hydroxide, or a similar metal hydroxide; aluminum nitride, silicon nitride, boron nitride, or a similar nitride; boron carbide, titanium carbide, silicon carbide, or a similar carbide; graphite, or a similar graphite; aluminum, copper, nickel, silver, or a similar metal; or a mixture thereof. In particular, when it is necessary to impart to the obtained silicone composition electrical insulating properties, it is recommended as component (B) to use at least one selected from a metal oxide, metal hydroxide, nitride, carbide, or a mixture thereof, more preferably, at least one type selected from the group consisting of aluminum oxide, crystalline silica, zinc oxide, magnesium oxide, titanium oxide, beryllium oxide, aluminum hydroxide, and magnesium hydroxide.

There are no special restrictions with regard to the shape of component (B). The shape may be spherical, needle-shaped, flake-shaped, or irregular in shape. In particular, when component (B) comprises aluminum oxide or crystalline silica, the spherical or irregular shape is preferable. Spherical aluminum oxide is represented mainly by α-alumina obtained by a hot spray method or by hydrothermal treatment of alumina hydrate. In the context of the present patent application, the term "spherical" covers not only a regular spherical shape but a round shape in general. Also, there are no special restrictions with regard to the diameter of component (B). The diameter may be in the range of 0.01 to 200 μm, preferably 0.01 to 150 μm, and most preferably 0.01 to 100 μm.

Component (B) is added in an amount of 400 to 3,500 parts by mass, preferably 400 to 3,000 parts by mass, and most preferably 500 to 2,500 parts by mass per 100 parts by mass of component (A). If the added amount of component (B) is below the recommended lower limit, the obtained silicone composition will not possess the required thermal conductivity. If, on the other hand, the added amount exceeds the upper recommended limit, this will impair handleability and workability of the obtained silicone composition.

The fine silica powder of component (C) is a component that imparts to the composition resistance to sliding-off when the surface coated with this composition assumes a vertical position. Component (C) can be exemplified by fumed silica, precipitated silica, or a similar finely powdered silica; and a hydrophobized silica obtained by surface-coating the aforementioned fine powder silica with alkoxysilane, chlorosilane, silazanes, or a similar organic silicon-containing compound. There are no special limitations with regard to the particle diameter of component (C), but it is recommended that the particles have a BET specific area no less than 50 m$^2$/g, preferably no less than 100 m$^2$/g.

Component (C) is added to the composition in an amount of 0.1 to 10 parts by mass and preferably 0.5 to 10 parts by mass per 100 parts by mass of component (A). If component (C) is added in an amount less than the recommended lower limit, then the coating will slide-off when the surface coated with the obtained silicone composition assumes a vertical position. If, on the other hand, component (C) is added in an amount exceeding the recommended upper limit, this will impair handleability and workability of the obtained silicone composition.

The organopolysiloxane of component (D) is represented by the following general formula:

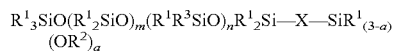

$R^1{}_3SiO(R^1{}_2SiO)_m(R^1R^3SiO)_nR^1{}_2Si\text{—}X\text{—}SiR^1{}_{(3-a)}(OR^2)_a$ In this formula, X represents an oxygen atom or a bivalent hydrocarbon group having 2 to 10 carbon atoms. The bivalent hydrocarbon represented by X can be exemplified by ethylene, propylene, butylene, or methylethylene groups. Preferable are ethylene and propylene groups. In the formula, $R^1$ represents identical or different monovalent hydrocarbon groups which are free of unsaturated aliphatic bonds. Such groups can be exemplified by methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, or other linear-chain alkyl groups; isopropyl, tertiarybutyl, isobutyl, 2-methylundecyl, 1-hexylheptyl, or similar branched-chain alkyl groups; cyclopentyl, cyclohexyl, cyclododecyl, or similar cyclic alkyl groups; phenyl, tolyl, xylyl, or similar aryls; benzyl, phenethyl, 2-(2,4,6-trimethylphenyl) propyl, or similar aralkyl groups; 3,3,3-trifluoropropyl, 3-chloropropyl, or similar halogenated alkyl groups. Most preferable are alkyl and aryl groups, especially methyl and phenyl groups. Furthermore, $R^2$ may also represent alkyl, alkoxyalkyl, alkenyl, or acyl groups. The alkyl groups represented by $R^2$ may be exemplified by the same linear-chain alkyl groups, branched alkyl groups, and cyclic alkyl groups as defined above. The alkoxyalkyl groups designated by $R^2$ may be exemplified by methoxyethyl or methoxypropyl groups. The alkenyl groups designated by $R^2$ may be exemplified by vinyl, allyl, butenyl, pentenyl, or hexenyl groups. The acyl groups represented by $R^2$ may be exemplified by acetyl or octanoyl groups. In the above formula, $R^3$ is represented by the following general formula: —X—SiR$^1{}_{(3-b)}$(OR$^2$)$_b$ (wherein X, $R^1$, and $R^2$ are the same as defined above; and "b" is an integer ranging from 1 to 3; the value of "b" equal to 3 is preferable. In the formula, "m" is an integer equal to or greater than 0; and "n" is also an integer equal to or greater than 0; however, when "a" is equal to 0, "n" is an integer equal to or greater than 1. At 25° C., viscosity of component (D) should not exceed 500 mPa·s, preferably should not exceed 400 mPa·s, and preferably should not exceeds 300 mPa·s. If the viscosity exceeds the recommended upper limit, then in the presence of a large amount of component (B), the obtained silicone composition will either have low flowability, or will be subject to separation and precipitation of component (B) during storage.

Component (D) may be exemplified by the compounds given below:

a dimethylpolysiloxane of the following formula:

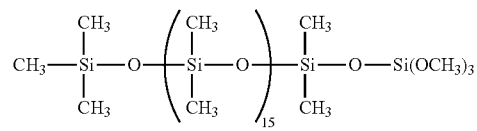

a dimethylpolysiloxane of the following formula:

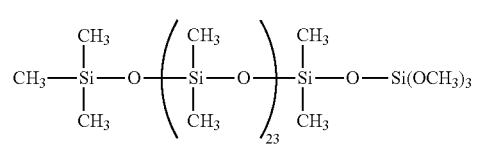

a dimethylpolysiloxane of the following formula:

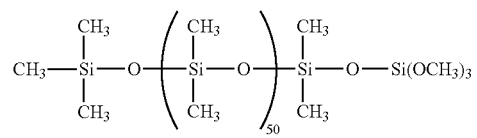

a dimethylpolysiloxane of the following formula:

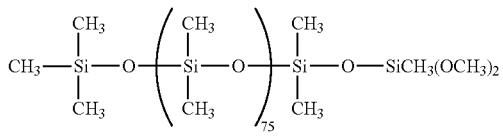

a dimethylpolysiloxane of the following formula:

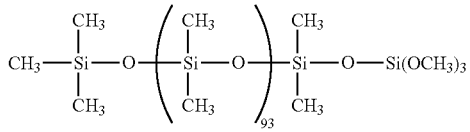

a copolymer of a dimethylsiloxane and a methylphenylsiloxane of the following formula:

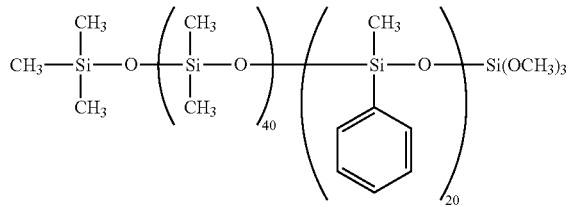

a copolymer of a dimethylsiloxane and a diphenylsiloxane of the following formula:

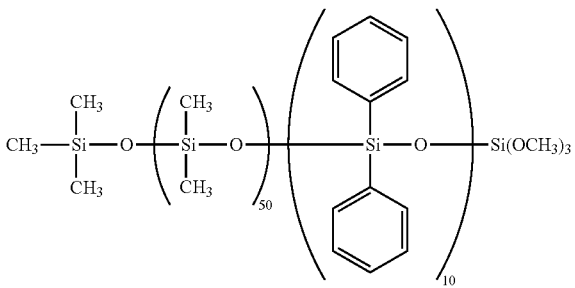

a dimethyl polysiloxane of the following formula:

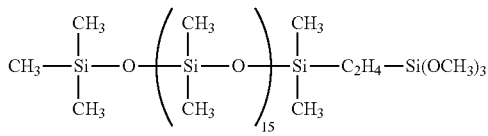

a dimethyl polysiloxane of the following formula:

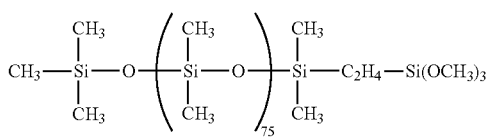

a dimethyl polysiloxane of the following formula:

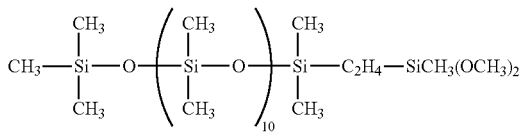

and a dimethyl polysiloxane of the following formula:

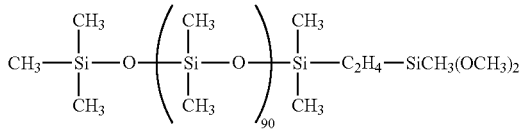

Component (D) is added to the composition in an amount of 0.005 to 10 parts by mass, preferably 0.05 to 10 parts by mass, more preferably 0.1 to 10 parts by mass, and most preferably 0.1 to 5 parts by mass per 100 parts of component (B). If component (D) is added in an amount less than the recommended lower limit, then, in case of a large amount of component (B), the obtained silicone composition will have low flowability and component (B) will precipitate and will separated in storage. If, on the other hand, the added amount exceeds the recommended upper limit, this will impair physical properties of the obtained silicone composition.

The silane compound of component (E) is represented by following general formula:

$$R^4{}_{(4-c)}Si(OR^2)_c$$

In this formula, $R^4$ may designate a monovalent hydrocarbon group, epoxy-containing organic group, methacryl-containing organic group, or an acryl-containing organic group. The monovalent hydrocarbon group designated by $R^4$ is exemplified by methyl, ethyl, propyl, butyl, pentyl, hexyl, decyl, or a similar alkyl group; isopropyl, tertiarybutyl, isobutyl, or similar branched-chain alkyl groups; cyclohexyl, or similar cyclic alkenyl groups; vinyl, allyl, butenyl, pentenyl, hexenyl, heptenyl, or a similar alkenyl group; phenyl, tolyl, xylyl, or similar aryl groups; benzyl, phenethyl, or similar aralkyl groups; 3,3,3-trifluoropropyl, 3-chloropropyl, or similar halogenated alkyl groups, and other substituted or unsubstituted monovalent hydrocarbon groups. The epoxy-containing organic group designated by $R^4$ is exemplified by 3-glycidoxypropyl, 4-glycidoxybutyl, or similar glycidoxyalkyl groups; 2-(3,4-epoxycyclohexyl)ethyl, 3-(3,4-epoxycyclohexyl) propyl, or similar epoxycyclohexylalkyl groups. The methacryl-containing organic group designated by $R^4$ is exemplified by 3-methacryloxypropyl, 4-methacryloxybutyl, or similar methacryloxyalkyl groups. The acryl-containing organic group designated by $R^4$ is exemplified by 3-acryloxypropyl, 4-acryloxybutyl, or similar acryloxyalkyl groups. $R^2$ designates alkyl, alkoxyalkyl, alkenyl, or acyl groups. These groups are exemplified by the same respective groups as defined above. In the formula, "c" is an integer between 1 and 3, where 3 is a preferable value.

The following are specific examples of component (E): methyl trimethoxysilane, methyl triethoxysilane, ethyl trimethoxysilane, n-propyl trimethoxysilane, butyl trimethoxysilane, pentyl trimethoxysilane, vinyl trimethoxysilane, vinyl triethoxysilane, methyl vinyl dimethoxysilane, allyl trimethoxysilane, allyl methyl dimethoxysilane, butenyl trimethoxysilane, 3-glycidoxypropyl trimethoxysilane, 3-glycidoxypropyl methyl dimethoxysilane, 3-glycidoxypropyl triethoxysilane, 3-methacryloxypropyl trimethoxysilane, 3-methacryloxypropyl triethoxysilane, 3-methacryloxypropyl methyl dimethoxysilane, 3-acryloxypropyl trimethoxysilane, or 3-acryloxypropyl methyl dimethoxysilane.

Component (E) is added in an amount of 0.005 to 10 parts by mass, preferably 0.01 to 10 parts by mass, and most preferably 0.01 to 5 parts by mass per 100 parts by mass of component (B). If component (E) is added in an amount less than the recommended lower limit, then in the case of a large amount of component (B), this will either impair handleability and workability of the obtained silicone composition, or will cause separation and precipitation of component (B) during storage. If, on the other hand, component (E) is added in an amount exceeding the recommended upper limit, this will increase the amount of components that do not contribute to surface treatment of component (B).

Examples of methods for treating the surface of component (B) with components (D) and (E) are the following: a method consisting of pre-treating the surface of component (B) with component (D) and then treating with component (E); a method consisting of pre-treating the surface of component (B) with component (E) and then treating with component (D); a method consisting of treating the surface of component (B) simultaneously with components (D) and (E); a method consisting of pre-treating the surface of component (B) in component (A) with component (D) and then with component (E); a method consisting of pre-treating the surface of component (B) in component (A) with component (E) and then with component (D); a method consisting of treating the surface of component (B) in component (A) simultaneously with components (D) and (E); a method consisting of treating the surface of component (B) in component (A) with component (E), however, prior to treating with component pretreated (E) the surface of component (B) is pretreated with component (D); or a method consisting of treating the surface of component (B) in component (A) with component (D), however, prior to treating with component pretreated (E) the surface of component (B) is pretreated with component (E). In the composition of the invention prepared from the components described above, components (D) and (E) are used either in the form applied onto the surface of component (B), or are added directly to the composition as separate components. If components (B) is pretreated with components (D) and (E), then for acceleration of the treatment the process may be carried out either with heating or with an addition of an acetic acid, phosphoric acid, or another acidic substance along with trialkylamine, quaternary ammonium salt, gaseous ammonia, ammonium carbonate, or another basic substance, the catalysts of both types being used simultaneously and in catalytic quantities.

Within the limits not contradictory to the objects of the invention, the composition may contain some arbitrary components, such as, e.g., fumed titanium oxide as a filler; the aforementioned filler having its surface hydrophobized with an organic silicon compound; pigments, dyes, fluorescence dyes, heat-resistant agents, triazol-type compound, or similar flame retardants; plasticizers, or adhesion improvers.

Addition of a curing agent makes the composition curable. If the composition is to be cured with a hydrosilylation reaction, such a curing agent is composed of a platinum-based catalyst and an organopolysiloxane having in one molecule on average two or more silicon-bonded hydrogen atoms. Silicon-bonded groups contained in the aforementioned organopolysiloxane may comprise the same alkyl, branched alkyl, cyclic alkyl, aryl, aralkyl, or halogenated alkyl groups as defined earlier. Preferable are alkyl and aryl groups, especially methyl and phenyl groups. There are no special restrictions with regard to viscosity of the aforementioned organopolysiloxane at 25° C., but it may be recommended to provide the viscosity in the range of 1 to 100,000 mPa·s, preferably 1 to 5,000 mPa·s. Also, there are no restrictions with regard to the molecular structure of the organopolysiloxane which may have a linear, branched, partially branched linear, cyclic, or dendrimer-type molecular structure. The aforementioned organopolysiloxane may comprise a monomer with the aforementioned molecular structures, copolymers with aforementioned molecular structures, or mixtures of the above.

More specifically, the organopolysiloxane mentioned above can be exemplified, e.g., by the following compounds: a dimethylpolysiloxane capped at both molecular terminals with dimethylhydrogensiloxy groups; a copolymer of a dimethylsiloxane and a methylhydrogensiloxane capped at both molecular terminals with trimethylsiloxy groups; a copolymer of a dimethylpolysiloxane and a methylhydrogensiloxane capped at both molecular terminals with dimethylhydrogensiloxy groups; an organopolysiloxane composed of siloxane units represented by the following unit formulae: $(CH_3)_3SiO_{1/2}$, $(CH_3)_2HSiO_{1/2}$, and $SiO_{4/2}$; or mixtures of two or more of the above compounds.

The aforementioned organopolysiloxane is added to the composition in an amount required for curing. More specifically, it is recommended to add the organopolysiloxane in such an amount that the content of the silicon-bonded hydrogen atoms of this component is in the range of 0.1 to 10 moles, preferably 0.1 to 5 moles, and most preferably 0.1 to 3 moles per 1 mole of the silicon-bonded alkenyl groups contained in component (A). If the organopolysiloxane is added in an amount less than the recommended lower limit, the obtained silicone composition will be insufficiently cured. If, on the other hand, the organopolysiloxane is added in an amount exceeding the recommended upper limit, a cured body of the composition will become too hard, and its surface will be subject to development of multiple cracks.

The platinum-based catalyst is used for accelerating curing of the composition. For example, this can be a chloroplatinic acid, an alcohol solution of a chloroplatinic acid, a platinum-olefin complex, platinum-alkenylsiloxane complex, or a platinum-carbonyl complex.

The platinum-based catalyst is added to the composition in an amount required for curing the composition. In particular, in terms of mass units, the catalyst is added in an amount of 0.01 to 1,000 ppm, preferably of 0.1 to 500 ppm of metallic-platinum mass per mass of component (A). If the catalyst is added in an amount less than the recommended lower limit, the obtained silicone composition will be insufficiently cured. If, on the other hand, the catalyst is added in an amount exceeding the recommended upper limit, this will not significantly increase the curing speed.

For adjusting the speed of curing and for improving handleability and workability, the composition may also incorporate 2-methyl-3-butyn-2-ol, 2-phenyl-3-butyn-2-ol, 1-ethynyl-1-cyclohexanol, or a similar acetylene-based compound; 3-methyl-3-penten-1-yne, 3,5-dimethyl-3-hexen-1-yne, or a similar enyne-based compound; as well as hydrazine-based compounds, phosphine-based compounds, mercaptane-based compounds, or similar curing-reaction inhibitors. There are no special restrictions with regard to the amounts in which these curing inhibitors can be added to the composition. It may be recommended, however, to add the curing inhibitors in an amount of 0.0001 to 1.0 parts by mass per 100 parts by mass of component (A).

In the case wherein the composition is cured by a condensation reaction, the curing agent may comprise a siloxane oligomer or silane having in one molecule at least three silicon-bonded hydrolyzable groups and, if necessary, a condensation-reaction catalyst. The aforementioned silicon-bonded hydrolyzable groups contained in the silane may be exemplified by the same amide, aminoxy, amino, alkenoxy, ketoxime, acyloxy, alkoxyalkoxy, or alkoxy groups. Apart from the hydrolyzable groups, silicon atoms of the aforementioned silane may be bonded to the same linear-chain alkyl, branch-chain alkyl, cyclic alkyl, alkenyl, aryl, aralkyl, or halogenated alkyl groups as those mentioned above. More specifically, the silanes or siloxane oligomers can be exemplified by tetraethoxysilane, methyl triethoxysilane, vinyl trimethoxysilane, methyl tris(methylethylketoxime)silane, vinyl triacetoxysilane, or ethyl orthosilicate.

The aforementioned silane or siloxane oligomer is added in an amount required for curing the composition. More specifically, these compounds can be added in an amount of 0.01 to 20 parts by mass, preferably 0.1 to 10 parts by mass per 100 parts by mass of component (A). If the silane or siloxane oligomer is added in an amount less than the recommended lower limit, this will impair stability of the composition during storage and reduce adhesive properties. If, on the other hand, the added amount exceeds the recommended upper limit, this will significantly delay curing of the composition.

The condensation-reaction catalyst is an arbitrary component, which may not be present if a silane having, e.g., an aminoxy, amino, ketoxime, or a similar hydrolyzable group is used in the composition as a curing agent. The condensation-reaction catalyst may be exemplified by tetrabutyl titanate, tetraisopropyl titanate, or a similar organic titanium acid ester; diisopropoxy bis(acetylacetate) titanium, diisopropoxy bis(ethylacetoacetate) titanium, or a similar titanium chelate compound; aluminum tris(acetylacetonate), aluminum tris (ethyacetoacetate), or a similar organic aluminum compound; zirconium tetra(acetylacetonate), zirconium tetrabutylate, or a similar organic zirconium compound; dibutyl tin dioctate, dibutyl tin dilaurate, butyl tin 2-ethylhexoate, or a similar organic tin compound; tin naphthenate, tin oleate, tin butylate, cobalt naphthenate, zinc stearate, or a similar salt of an organic carboxylic acid; hexylamine, dodecylamine phosphate, or similar amine compounds, or salts thereof; benzyl triethyl ammonium acetate, or a similar tertiary ammonium salt; potassium acetate, or a similar lower fatty acid salt of an alkali metal; dimethyl hydroxylamine, diethyl hydroxylamine, or a similar dialkyl hydroxylamine; or a guanidyl group-containing organic silicon compound.

The condensation-reaction catalyst can be added to the composition in an arbitrary amount, preferably in an amount required for curing. More specifically, this component can be added in an amount of 0.01 to 20 parts by mass, preferably 0.1 to 10 parts by mass per 100 parts by mass of component (A). If this catalyst is required and used in an amount less than the lower recommended limit, the obtained composition will not be cured to a sufficient degree. If, on the other hand, the catalyst is added in an amount exceeding the recommended upper limit, this will impair storage stability of the obtained composition.

If curing of the composition can be carried out by a free-radical reaction of an organic peroxide, the latter can be used as a curing agent. Such an organic peroxide can be represented, e.g., by a benzoyl peroxide, di(p-methylbenzoyl) peroxide, di(o-methylbenzoyl) peroxide, dicumyl peroxide, 2,5-dimethyl-2,5-bis(t-butylperoxy) hexane, di-t-butyl peroxide, or t-butyl peroxy benzoate. The organic peroxide should be added in an amount required for curing the composition. In particular, it can be added in an amount of 0.1 to 5 parts by mass per 100 parts by mass of component (A).

At room temperature, the composition may be in the form of a grease, paste, or a viscous substance. If the composition is to be curable, there are no limitations with regard to a method that can be used for curing the composition. For example, the composition can be cured by retaining at room temperature after the composition is formed. Alternatively, the composition can cured by heating at a temperature of 50° C. to 200° C. after the formation. There are no special restrictions with regard to a form in which a cured silicone product obtained from the composition can be produced. For example, the cured product may be in the form of gel, soft rubber, or hard rubber. The cured silicone product may contact with the heat-dissipating member sufficiently.

An electronic device of the invention will now be described with reference to FIG. 1. This electronic device contains an electronic part 1 placed onto a circuit board 2. The circuit of the circuit board 2 is electrically connected to output lead wires 3 of the electronic part 1. A via hole [not shown] is formed in the circuit board for effective removal of heat generated by the electronic part 1. The structure of the electronic device of the invention includes a heat-dissipating member 5, which is connected to the electronic element through the thermally conductive silicone composition 4 and intended for removal of heat generated by the electronic part 1. In particular, the thermally conductive silicone composition is sandwiched between the circuit board 3 and the heat-dissipating member 5 and is intended for operation in a vertical position. However, even when the member 5 operates in the above position and under severe temperature conditions, it is not subject to slipping-off and therefore is characterized by excellent reliability.

As has been mentioned above, in the electronic device of the invention, the thermally conductive silicone composition 4 is sandwiched between the circuit board 3 and the heat-dissipating member 5. Although there are no special restrictions with regard to the thickness of the thermally conductive silicone composition, from the viewpoint of preventions of slip-off conditions and efficient removal of heat from the electronic part 1, it is recommended to have the thickness of the composition in the range of 0.1 to 2 mm.

EXAMPLES

The thermally conductive silicone composition and the electronic device of the invention will now be described in more details with reference to practical examples. In these examples, all values of viscosity refer to viscosities at 25° C.

The following methods were used for measuring viscosity, thermal conductivity, and resistance to slip-off in a vertical position.

[Viscosity]

Viscosity (Pa·s) of the thermally conductive composition at 25° C. was measured by means of a rheometer (Model AR550, the product of TA Instruments, Ltd.). The geometry comprised parallel plates having a diameter of 20 mm. Measurement was carried out under the following conditions: a 200 μm gap, shear rates: 1.0 and 10.0 (1/s). The ratio of viscosity at the shear rate of 1.0 to viscosity at the shear rate of 10.0 was indicated in terms of a thixotropy ratio.

[Thermal Conductivity]

The thermally conductive silicone composition was placed into a 60 mm×150 mm×25 mm container, and after defoaming, the surface of the composition was coated with a polyvinylidene chloride film having a thickness of 10 μm. Following this, thermal conductivity (W/mK) of the thermally conductive silicone composition was measured by means of a high-speed heat-conductivity meter (the heat ray method) of the Kyoto Denshi Kogyo Co., Ltd.

[Resistance to Slip-Off in a Vertical Position]

Figure 2:
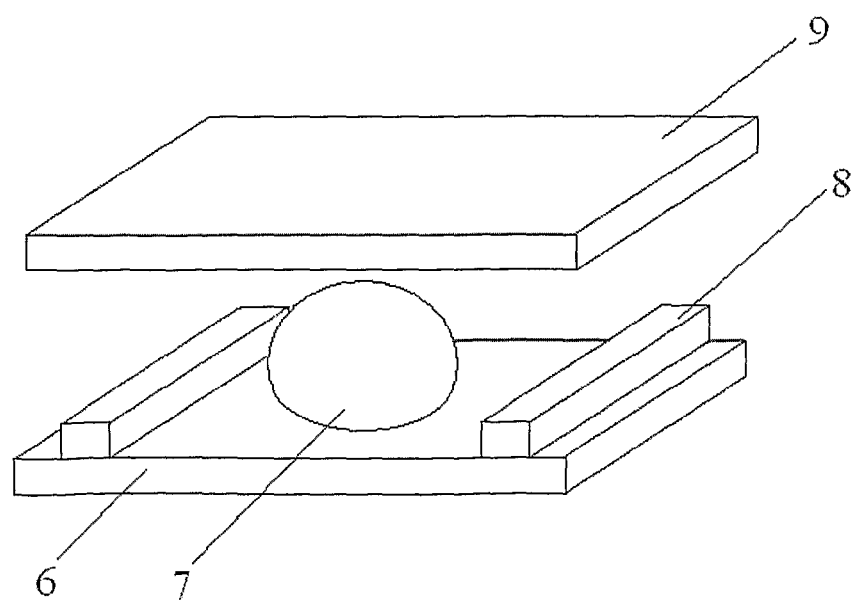
FIG. 2 is a schematic view that illustrates a method for manufacturing a test piece for evaluation of resistance to slip-off.
Figure 3:
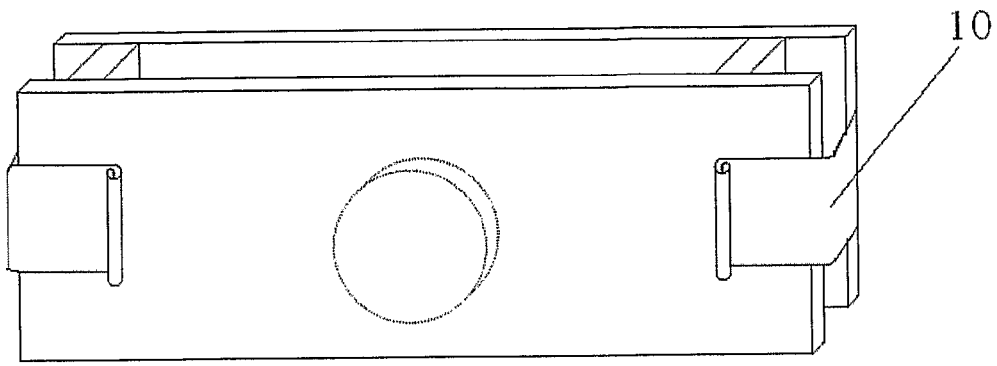
FIG. 3 is a three-dimensional view of a test piece for evaluating resistance to slip-off in a vertical position.
Figure 4:
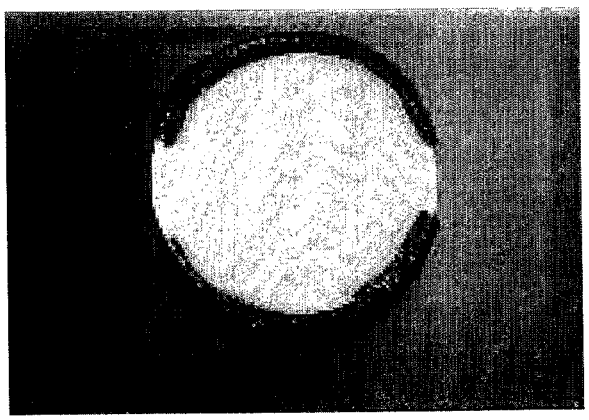
FIG. 4 is a photograph that shows the condition of the thermally conductive silicone composition of Practical Example 1 after evaluation of resistance to slip-off in a vertical position when the gap value was equal to 1.5 mm.
Figure 5:
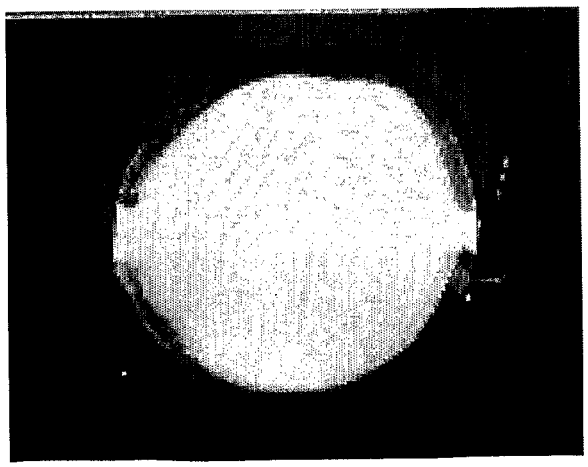
FIG. 5 is a photograph that shows the condition of the thermally conductive silicone composition of Practical Example 2 after evaluation of resistance to slip-off in a vertical position when the gap value was equal to 1.5 mm.
Figure 6:
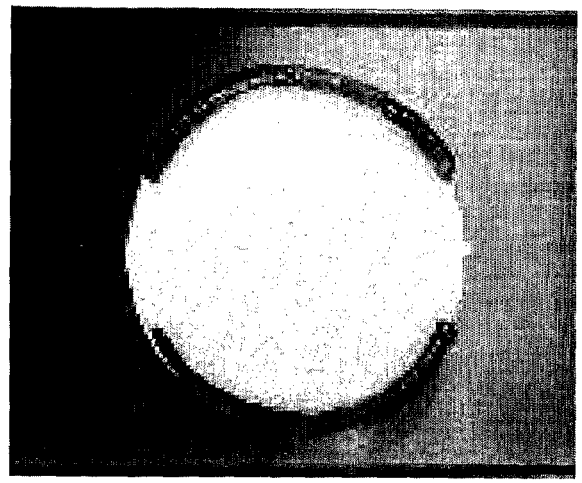
FIG. 6 is a photograph that shows the condition of the thermally conductive silicone composition of Practical Example 3 after evaluation of resistance to slip-off in a vertical position when the gap value was equal to 1.5 mm.
Figure 7:
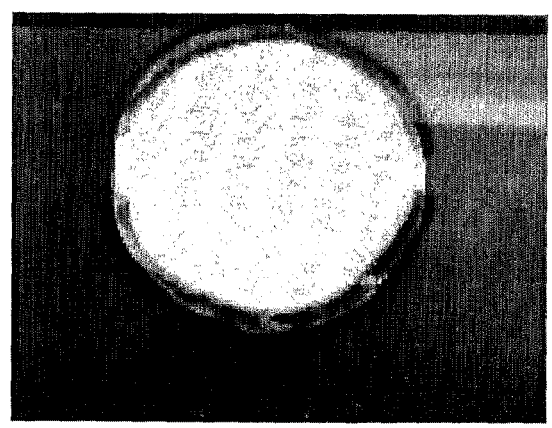
FIG. 7 is a photograph that shows the condition of the thermally conductive silicone composition of Practical Example 4 after evaluation of resistance to slip-off in a vertical position when the gap value was equal to 1.5 mm.
Figure 8:
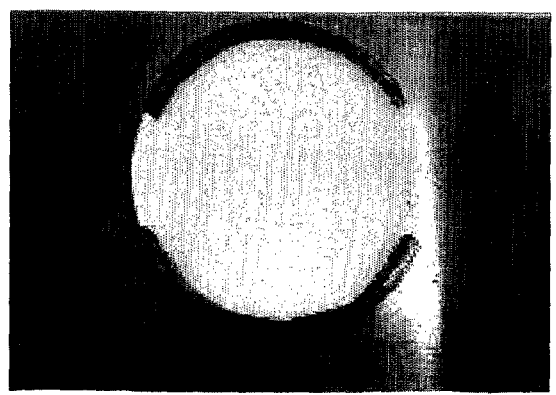
FIG. 8 is a photograph that shows the condition of the thermally conductive silicone composition of Practical Example 5 after evaluation of resistance to slip-off in a vertical position when the gap value was equal to 1.5 mm.
Figure 9:
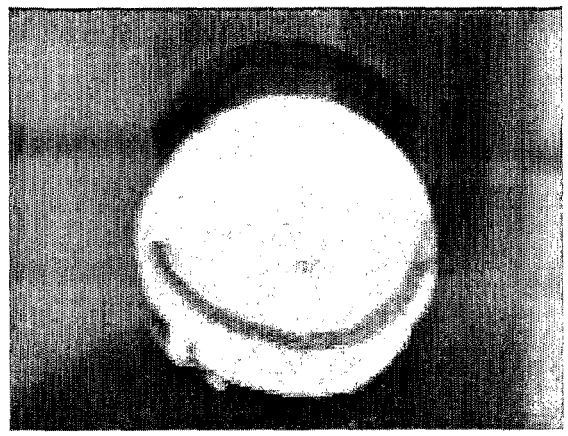
FIG. 9 is a photograph that shows condition of the thermally conductive silicone composition of Comparative Example 1 after evaluation of resistance to slip-off in a vertical position when a gap value was equal to 1.5 mm.
Figure 10:
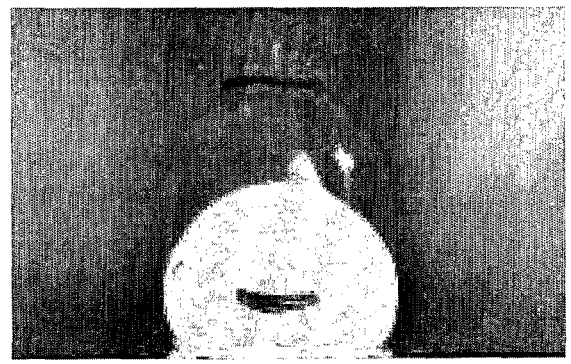
FIG. 10 is a photograph that shows the condition of the thermally conductive silicone composition of Comparative Example 2 after evaluation of resistance to slip-off in a vertical position when the gap value was equal to 1.5 mm.

Resistance of the thermally conductive composition to slip-off in a vertical position was tested by a method shown in FIGS. 2 and 3. More specifically, a predetermined quantity of the thermally conductive silicone composition was applied onto the a copper plate 6, and the applied composition was then sandwiched between the copper plate 6 and a glass plate 9 that was placed onto spacers 8 having thickness of 1.0 mm or 1.5 mm. The manufacture of a test piece for testing resistance to slip-off was completed by fixing the copper plate 6 and the glass plate 9 together with the use of clips 10. The test piece was arranged so that the contact plane between the copper plate and the thermally conductive silicone composition assumed a vertical position, and then the composition of the test piece was subjected to a one-cycle thermal-shock test under the following conditions: −40° C., 30 min. and 140° C., 30 min. Upon completion of the test, the appearance of the conductive thermal composition was visually inspected, and the condition of the post-test slip-off was evaluated based on the following criteria: ○—no slip-off; Δ—slight slip-off; and X—significant slip-off.

Practical Example 1

A mixture was obtained by mixing the following components at room temperature in a Ross mixer: 100 parts by mass of a dimethylpolysiloxane capped at both molecular terminals with dimethylvinylsiloxy groups (viscosity: 2,000 mPa·s); 26 parts by mass of a dimethylpolysiloxane (viscosity: 25 mPa·s) represented by the following formula:

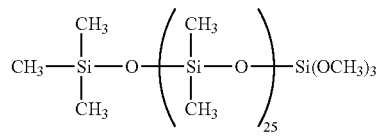

and 4 parts by mass of fumed silica having a BET specific surface area of 200 m²/g and hydrophobically surface-treated with hexamethyldisilazane. The mixture was then combined and further mixed with the following components: 200 parts by mass of a finely powdered zinc oxide having an average particle size of 0.12 μm; 500 parts by mass of finely crushed alumina powder having an average particles size of 1.2 μm; and 470 parts by mass of a finely powdered alumina having round particles with an average particle diameter of 20 μm. Following this, 13 parts by mass of methyl trimethoxysilane were added, the components were uniformly mixed, and stirred under a reduced pressure for 1 hour at 150° C. The product was cooled to room temperature, atmospheric pressure was restored, and as a result, a thermally conductive composition was obtained. Characteristics of the obtained thermally conductive silicone composition were measured. The results of measurements are shown in Table 1.

Practical Example 2

A mixture was obtained by mixing the following components at room temperature in a Ross mixer: 100 parts by mass of a dimethylpolysiloxane capped at both molecular terminals with dimethylvinylsiloxy groups (viscosity: 2,000 mPa·s); 26 parts by mass of a dimethylpolysiloxane (viscosity: 125 mPa·s) represented by the following formula:

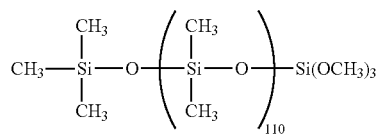

and 4 parts by mass of fumed silica having a BET specific surface area of 200 m²/g and hydrophobically surface-treated with hexamethyldisilazane. The mixture was then combined and further mixed with the following components: 200 parts by mass of a finely powdered zinc oxide having an average particle size of 0.12 μm; 500 parts by mass of finely crushed alumina powder having an average particle size of 1.2 μm; and 470 parts by mass of a finely powdered alumina having round particles with an average particle diameter of 20 μm. Following this, 13 parts by mass of methyl trimethoxysilane were added, the components were uniformly mixed, and stirred under a reduced pressure for 1 hour at 150° C. The product was cooled to room temperature, atmospheric pressure was restored, and as a result, a thermally conductive composition was obtained. Characteristics of the obtained thermally conductive silicone composition were measured. The results of measurements are shown in Table 1.

Practical Example 3

A mixture was obtained by mixing the following components at room temperature in a Ross mixer: 48 parts by mass of a dimethylpolysiloxane capped at both molecular terminals with dimethylvinylsiloxy groups (viscosity: 10,000 mPa·s); 52 parts by mass of a dimethylpolysiloxane capped at both molecular terminals with dimethylvinylsiloxy groups (viscosity: 2,000 mPa·s); 25 parts by mass of a dimethylpolysiloxane (viscosity: 25 mPa·s) represented by the following formula:

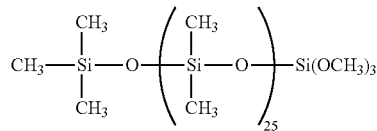

and 4 parts by mass of fumed silica having a BET specific surface area of 200 m²/g and hydrophobically surface-treated with hexamethyldisilazane. The mixture was then combined and further mixed with the following components: 220 parts by mass of a finely powdered zinc oxide having an average particle size of 0.12 μm; 520 parts by mass of finely crushed alumina powder having an average particle size of 1.2 μm; and 360 parts by mass of a finely powdered alumina having round particles with an average particle diameter of 20 μm. Following this, 14 parts by mass of methyl trimethoxysilane were added, the components were uniformly mixed, and stirred under a reduced pressure for 1 hour at 150° C. The product was cooled to room temperature, atmospheric pressure was restored, and as a result, a thermally conductive composition was obtained. Characteristics of the obtained thermally conductive silicone composition were measured. The results of measurements are shown in Table 1.

Practical Example 4

A mixture was obtained by mixing the following components at room temperature in a Ross mixer: 48 parts by mass of dimethylpolysiloxane capped at both molecular terminals with dimethylvinylsiloxy groups (viscosity: 10,000 mPa·s); 52 parts by mass of a dimethylpolysiloxane capped at both molecular terminals with dimethylvinylsiloxy groups (viscosity: 2,000 mPa·s); 25 parts by mass of dimethylpolysiloxane (viscosity: 125 mPa·s) represented by the following formula:

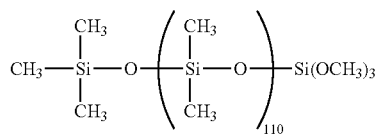

and 4 parts by mass of fumed silica having a BET specific surface area of 200 m²/g and hydrophobically surface-treated with a hexamethyldisilazane. The mixture was then combined and further mixed with the following components: 220 parts by mass of a finely powdered zinc oxide having an average particle size of 0.12 μm; 520 parts by mass of finely crushed alumina powder having an average particle size of 1.2 μm; and 360 parts by mass of a finely powdered alumina having round particles with an average particle diameter of 20 μm. Following this, 14 parts by mass of methyl trimethoxysilane were added, the components were uniformly mixed, and stirred under a reduced pressure for 1 hour at 150° C. The product was cooled to room temperature, atmospheric pressure was restored, and as a result, a thermally conductive composition was obtained. Characteristics of the obtained thermally conductive silicone composition were measured. The results of measurements are shown in Table 1.

Practical Example 5

A mixture was obtained by mixing the following components at room temperature in a Ross mixer: 48 parts by mass of a dimethylpolysiloxane capped at both molecular terminals with dimethylvinylsiloxy groups (viscosity: 10,000 mPa·s); 52 parts by mass of a dimethylpolysiloxane capped at both molecular terminals with dimethylvinylsiloxy groups (viscosity: 2,000 mPa·s); 25 parts by mass of a dimethylpolysiloxane (viscosity: 125 mPa·s) represented by the following formula:

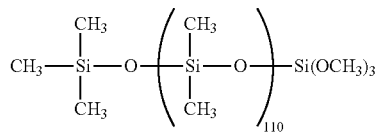

and 4 parts by mass of fumed silica having a BET specific surface area of 200 m²/g and hydrophobically surface-treated with hexamethyldisilazane. The mixture was then combined and further mixed with the following components: 220 parts by mass of a finely powdered French-method-processed zinc oxide having an average particle size of 0.12 μm; 520 parts by mass of finely crushed alumina powder having an average particle size of 1.2 μm; and 360 parts by mass of a finely powdered alumina having round particles with an average particle diameter of 20 μm. Following this, 14 parts by mass of a 3-glycidoxypropyl trimethoxysilane were added, the components were uniformly mixed, and stirred under a reduced pressure for 1 hour at 150° C. The product was cooled to room temperature, atmospheric pressure was restored, and as a result, a thermally conductive composition was obtained. Characteristics of the obtained thermally conductive silicone composition were measured. The results of measurements are shown in Table 1.

Comparative Example 1

A mixture was obtained by mixing the following components at room temperature in a Ross mixer: 100 parts by mass of a dimethylpolysiloxane capped at both molecular terminals with dimethylvinylsiloxy groups (viscosity: 2,000 mPa·s); 26 parts by mass of a dimethylpolysiloxane (viscosity: 115 mPa·s) represented by the following formula:

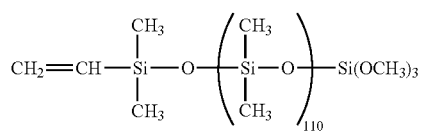

and 4 parts by mass of fumed silica having a BET specific surface area of 200 m²/g and hydrophobically surface-treated with hexamethyldisilazane. The mixture was then combined and further mixed with the following components: 200 parts by mass of a finely powdered French-method-processed zinc oxide having an average particle size of 0.12 μm; 500 parts by mass of finely crushed alumina powder having an average particle size of 1.2 μm; and 470 parts by mass of a finely powdered alumina having round particles with an average particle diameter of 20 μm. Following this, 13 parts by mass of a methyl trimethoxysilane were added, the components were uniformly mixed, and stirred under a reduced pressure for 1 hour at 150° C. The product was cooled to room temperature, atmospheric pressure was restored, and as a result, a thermally conductive composition was obtained. Characteristics of the obtained thermally conductive silicone composition were measured. The results of measurements are shown in Table 1.

Comparative Example 2

A mixture was obtained by mixing the following components at room temperature in a Ross mixer: 92 parts by mass of a dimethylpolysiloxane capped at both molecular terminals with dimethylvinylsiloxy groups (viscosity: 10,000 mPa·s); 8 parts by mass of a dimethylpolysiloxane (viscosity: 2000 mPa·s); 24 parts by mass of a dimethylpolysiloxane (viscosity: 25 mPa·s) represented by the following formula:

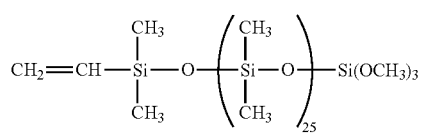

and 4 parts by mass of fumed silica having a BET specific surface area of 200 m²/g and hydrophobically surface-treated with hexamethyldisilazane. The mixture was then combined and further mixed with the following components: 230 parts by mass of a finely powdered French-method-processed zinc oxide having an average particle size of 0.12 μm; 490 parts by mass of finely crushed alumina powder having an average particle size of 1.2 μm; and 360 parts by mass of a finely powdered alumina having round particles with an average particle diameter of 20 μm. Following this, 12 parts by mass of methyl trimethoxysilane were added, the components were uniformly mixed, and stirred under a reduced pressure for 1 hour at 150° C. The product was cooled to room temperature, atmospheric pressure was restored, and as a result, a thermally conductive composition was obtained. Characteristics of the obtained thermally conductive silicone composition were measured. The results of measurements are shown in Table 1.

TABLE 1

| Characteristics | Examples | | | | | | |
|---|---|---|---|---|---|---|---|
| | Present Invention | | | | | Comparative Examples | |
| | 1 | 2 | 3 | 4 | 5 | 1 | 2 |
| Viscosity (Pa · s) | | | | | | | |
| Shear rate 1.0 | 949 | 762 | 1121 | 1145 | 777 | 843 | 1084 |
| Shear rate 10.0 | 277 | 302 | 366 | 438 | 345 | 263 | 412 |
| Thixotropy ratio | 3.4 | 2.5 | 3.1 | 2.6 | 2.3 | 3.2 | 2.6 |
| Thermal conductivity (W/mk) | 2.8 | 2.8 | 2.5 | 2.5 | 2.5 | 2.8 | 2.5 |
| Resistance to Slip-off in a vertical position | | | | | | | |
| Gap 1.0 mm | ○ | ○ | ○ | ○ | ○ | Δ | X |
| Gap 1.5 mm | ○ | ○ | ○ | ○ | ○ | Δ | X |

INDUSTRIAL APPLICABILITY

Since the thermally conductive silicone composition of the invention possesses excellent handleability and workability at low viscosity and since after application onto a surface the composition is not subject to slipping-off when this surface assumes a vertical position, even under harsh temperature conditions, this composition is suitable for use as a material for manufacturing parts of the automobile control units.

The invention claimed is:

1. A thermally conductive silicone composition comprising:
   (A) 100 parts by mass of a dimethylpolysiloxane capped at both molecular terminals with dimethylvinylsiloxy groups having a viscosity of from 2,000 to 10,000 mPa·s at 25° C.;
   (B) 400 to 3,500 parts by mass of a thermally conductive filler;
   (C) 0.1 to 10 parts by mass of a fine silica powder;
   (D) an organopolysiloxane represented by the general formula given below and having a viscosity of less than 500 mPa·s at 25° C.:

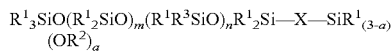

wherein X represents an oxygen atom or a bivalent hydrocarbon group having 2 to 10 carbon atoms; $R^1$ represents identical or different monovalent hydrocarbon groups which are free of unsaturated aliphatic bonds; $R^2$ represents groups selected from alkyl groups, alkoxyalkyl groups, alkenyl groups, or acyl groups; $R^3$ is represented by the following general formula: —X—$SiR^1_{(3-b)}$($OR^2$)$_b$, wherein X, $R^1$, and $R^2$ are the same as defined above; and "b" is an integer ranging from 1 to 3; "a" is an integer ranging from 0 to 3; "m" is an integer equal to or greater than 0; and "n" is an integer equal to or greater than 0; however, when "a" is equal to 0, "n" is an integer equal to or greater than 1, wherein component (D) is used in an amount of 0.005 to 10 parts by mass per 100 parts by mass of component (B); and (E) a silane compound of the following general formula:

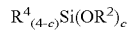

wherein $R^4$ is a monovalent hydrocarbon group; $R^2$ is the same as defined above; and "c" is an integer ranging from 1 to 3, wherein component (E) is used in an amount of 0.005 to 10 parts by mass per 100 parts by mass of component (B).

2. The thermally conductive silicone composition according to claim 1, wherein component (B) is a thermally conductive filler selected from a metal oxide, metal hydroxide, nitride, carbide, graphite, metal, or a mixture thereof.

3. The thermally conductive silicone composition according to claim 1, wherein component (B) is a thermally conductive filler of at least one type selected from the group consisting of aluminum oxide, zinc oxide, magnesium oxide, titanium oxide, beryllium oxide, aluminum hydroxide, and magnesium hydroxide.

4. The thermally conductive silicone composition according to claim 1, wherein component (B) is surface-treated with components (D) and (E) in component (A).

5. An electronic device comprising a heat-dissipating member, and electronic parts or circuit boards which support the electronic parts, wherein the heat-dissipating member is attached to the electronic parts or to the circuit boards through a thermally conductive silicone composition as claimed in claim 1.

6. The thermally conductive silicone composition according to claim 1, wherein component (A) contains silicon-bonded groups selected from alkyl groups, alkenyl groups and aryl groups.

7. The thermally conductive silicone composition according to claim 1, wherein component (B) is present in 500 to 2,500 parts by mass, and component (C) is present in 0.5 to 10 parts by mass.

8. The thermally conductive silicone composition according to claim 1 wherein component (D) has a viscosity of less than 300 mPa·s at 25° C.

9. The thermally conductive silicone composition according to claim 1, wherein component (D) is present in 0.1 to 10 parts by mass, and component (E) is present in 0.01 to 10 parts by mass.

10. The thermally conductive silicone composition according to claim 1, wherein component (D) is selected from the group of:

a dimethylpolysiloxane of the following formula:

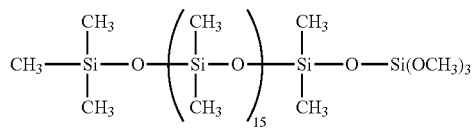

a dimethylpolysiloxane of the following formula:

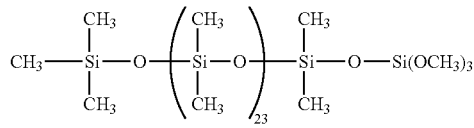

a dimethylpolysiloxane of the following formula:

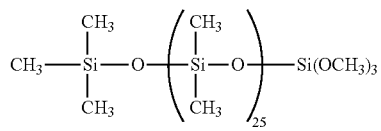

a dimethylpolysiloxane of the following formula:

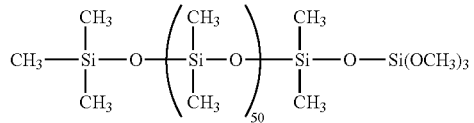

a dimethylpolysiloxane of the following formula:

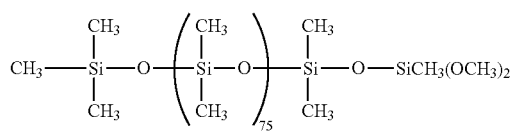

a dimethylpolysiloxane of the following formula:

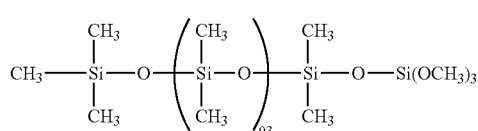

a dimethylpolysiloxane of the following formula:

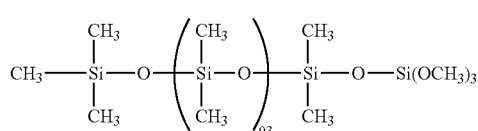

a copolymer of a dimethylsiloxane and a methylphenylsiloxane of the following formula:

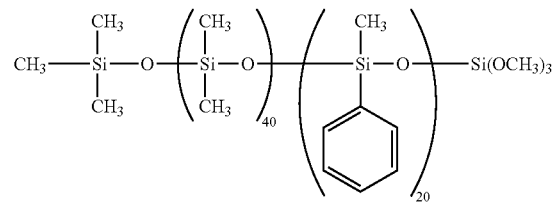

a copolymer of a dimethylsiloxane and a diphenylsiloxane of the following formula:

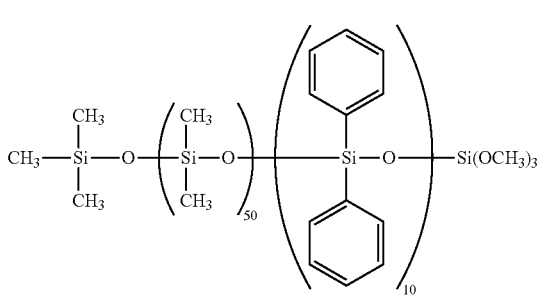

a dimethyl polysiloxane of the following formula:

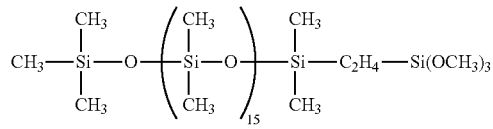

a dimethyl polysiloxane of the following formula:

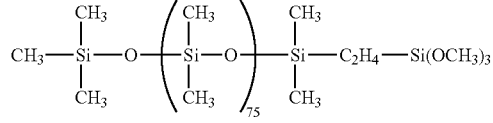

a dimethyl polysiloxane of the following formula:

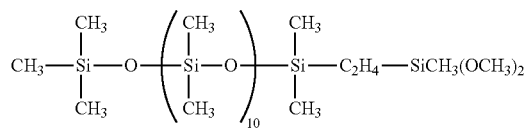

or and a dimethyl polysiloxane of the following formula:

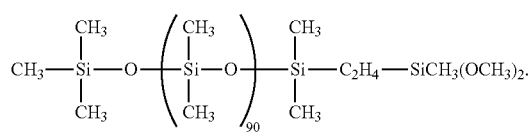

11. The thermally conductive silicone composition according to claim 1, wherein component (E) is methyl trimethoxysilane.

12. A thermally conductive silicone composition comprising:
- (A) 100 parts by mass of an organopolysiloxane having a viscosity of at least 500 mPa·s at 25° C.;
- (B) 400 to 3,500 parts by mass of a thermally conductive filler;
- (C) 0.1 to 10 parts by mass of a fine silica powder;
- (D) an organopolysiloxane represented by the general formula given below and having a viscosity of less than 500 mPa·s at 25° C.:

$$R^1{}_3SiO(R^1{}_2SiO)_m(R^1R^3SiO)_nR^1{}_2Si-X-SiR^1{}_{(3-a)}(OR^2)_a$$

wherein X represents an oxygen atom or a bivalent hydrocarbon group having 2 to 10 carbon atoms; $R^1$ represents identical or different monovalent hydrocarbon groups which are free of unsaturated aliphatic bonds; $R^2$ represents groups selected from alkyl groups, alkoxyalkyl groups, alkenyl groups, or acyl groups; $R^3$ is represented by the following general formula: $-X-SiR^1{}_{(3-b)}(OR^2)_b$, wherein X, $R^1$, and $R^2$ are the same as defined above; and "b" is an integer ranging from 1 to 3; "a" is an integer ranging from 0 to 3; "m" is an integer equal to or greater than 0; and "n" is an integer equal to or greater than 0; however, when "a" is equal to 0, "n" is an integer equal to or greater than 1, wherein component (D) is used in an amount of 0.005 to 10 parts by mass per 100 parts by mass of component (B); and
- (E) a silane compound of the following general formula:

$$R^4{}_{(4-c)}Si(OR^2)_c$$

wherein $R^4$ is a group selected from an epoxycyclohexylalkyl group, a methacryl-containing organic group, or an acryl-containing organic group; $R^2$ is the same as defined above; and "c" is an integer ranging from 1 to 3, wherein component (E) is used in an amount of 0.005 to 10 parts by mass per 100 parts by mass of component (B).

* * * * *